United States Patent
Kitahara et al.

(10) Patent No.: US 7,553,677 B2
(45) Date of Patent: Jun. 30, 2009

(54) METHOD FOR MANUFACTURING FERROELECTRIC MEMORY

(75) Inventors: Yukio Kitahara, Suwa (JP); Tatsuo Sawasaki, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/781,290

(22) Filed: Jul. 23, 2007

(65) Prior Publication Data

US 2008/0020490 A1 Jan. 24, 2008

(30) Foreign Application Priority Data

Jul. 24, 2006 (JP) .............................. 2006-200639

(51) Int. Cl.
*H01L 21/00* (2006.01)
(52) U.S. Cl. ............................ 438/3; 438/680; 438/692; 257/E21.17; 257/E21.267; 257/E21.304; 257/E21.645
(58) Field of Classification Search .................. 438/3, 438/238, 381, 475, 513, 637, 680, 692, 706, 438/723, 743, 756
See application file for complete search history.

(56) References Cited

U.S. PATENT DOCUMENTS 6,509,601 B1 * 1/2003 Lee et al. .................... 257/310

| | | | |
|---|---|---|---|
| 6,682,944 B2 * | 1/2004 | Kikuchi et al. ................. | 438/3 |
| 6,709,991 B1 * | 3/2004 | Kawahara et al. ........... | 438/791 |
| 6,908,867 B2 * | 6/2005 | Yokota ....................... | 438/781 |
| 6,995,092 B2 | 2/2006 | Umeda | |
| 7,221,015 B2 * | 5/2007 | Ando et al. ................. | 257/306 |
| 7,232,764 B1 * | 6/2007 | Yaegashi .................... | 438/702 |
| 7,259,416 B2 | 8/2007 | Miura | |
| 2007/0259454 A1 | 11/2007 | Miura | |

FOREIGN PATENT DOCUMENTS

| JP | 2001-210607 | 8/2001 |
|---|---|---|
| JP | 2003-068987 | 3/2003 |
| JP | 2003-115576 | 4/2003 |
| JP | 2003-172949 | 6/2003 |
| JP | 2003-347517 | 12/2003 |
| JP | 2004-235287 | 8/2004 |
| JP | 2005-327699 | 11/2005 |
| JP | 2006-060019 | 3/2006 |
| JP | 2006-060020 | 3/2006 |
| JP | 2006-060107 | 3/2006 |
| JP | 2006-186260 | 7/2006 |

* cited by examiner

*Primary Examiner*—David Nhu
(74) *Attorney, Agent, or Firm*—Harness, Dickey & Pierce, P.L.C.

(57) ABSTRACT

A method for manufacturing a ferroelectric memory includes the steps of: (a) forming a ferroelectric capacitor by sequentially laminating, on a substrate, a lower electrode, a ferroelectric layer and an upper electrode; (b) forming a first dielectric layer that covers the ferroelectric capacitor; (c) forming a contact hole in the first dielectric layer to expose the upper electrode; (d) heating the substrate to 350° C. or higher; and (e) forming a conductive layer inside the contact hole.

20 Claims, 4 Drawing Sheets

METHOD FOR MANUFACTURING FERROELECTRIC MEMORY

The entire disclosure of Japanese Patent Application No. 2006-200639, filed Jul. 24, 2006 is expressly incorporated by reference herein.

BACKGROUND

1. Technical Field

The present invention relates to a method for manufacturing a ferroelectric memory.

2. Related Art

A ferroelectric memory device (FeRAM) is a nonvolatile memory that is capable of low voltage and high speed operations. Its memory cell can be composed of one transistor and one capacitor (1T/1C), such that integration to the level of DRAM is possible. Accordingly, ferroelectric memory devices are highly expected as large capacity nonvolatile memories.

A ferroelectric layer that is used for such a ferroelectric memory device has a property that it can be deteriorated by hydrogen. Therefore, the capacitor is generally covered by a barrier layer to thereby protect the ferroelectric layer. An example of related art may be described in Japanese Laid-open Patent Application JP-A-2003-68987.

SUMMARY

In accordance with an advantage of some aspects of the invention, there is provided a method for manufacturing a ferroelectric memory which can prevent deterioration of the characteristics of its ferroelectric layer.

A method for manufacturing a ferroelectric memory in accordance with an embodiment of the invention includes the steps of:
(a) forming a ferroelectric capacitor by sequentially laminating, on a substrate, a lower electrode, a ferroelectric layer and an upper electrode;
(b) forming a first dielectric layer that covers the ferroelectric capacitor;
(c) forming a contact hole in the first dielectric layer to expose the upper electrode;
(d) heating the first dielectric layer to 350° C. or higher; and
(e) forming a conductive layer inside the contact hole.

The method for manufacturing a ferroelectric memory in accordance with an aspect of the embodiment may further include, before the step (a), the steps of (f) heating the substrate at 350° C. or higher, and (g) forming a first barrier layer, wherein the lower electrode may be formed above the first barrier layer.

The method for manufacturing a ferroelectric memory in accordance with an aspect of the embodiment may further include, before the step (f), the steps of forming a second dielectric layer on the substrate, and forming a contact hole in the second dielectric layer.

The method for manufacturing a ferroelectric memory in accordance with an aspect of the embodiment may further include, after the step (f), the step of embedding a conductive layer in the contact hole formed in the second dielectric layer.

In the method for manufacturing a ferroelectric memory in accordance with an aspect of the embodiment, before the step (f), a surface of the second dielectric layer may be washed with water.

In the method for manufacturing a ferroelectric memory in accordance with an aspect of the embodiment, after the step (f), the step (g) may be conducted without being exposed to an air atmosphere.

The method for manufacturing a ferroelectric memory in accordance with an aspect of the embodiment may include, between the step (a) and the step (b), the step of forming a second barrier layer that covers the ferroelectric capacitor, wherein, in the step (b), the first dielectric layer may be formed to cover the second barrier layer, and in the step (c), a contact hole may be formed in a manner to penetrate the second barrier layer and the first dielectric layer.

In the method for manufacturing a ferroelectric memory in accordance with an aspect of the embodiment, a surface of the first dielectric layer may be washed with water between the step (c) and the step (d).

In the method for manufacturing a ferroelectric memory in accordance with an aspect of the embodiment, the step (d) may be conducted while reducing a pressure to $1\times10^{-3}$ Pa to $1\times10^{-7}$ Pa, and elevating a temperature to 350° C. or higher.

In the method for manufacturing a ferroelectric memory in accordance with an aspect of the embodiment, the step (d) may be conducted while heating the substrate at 350° C. to 600° C.

DESCRIPTION OF EXEMPLARY EMBODIMENTS

Preferred embodiments of the invention are described below with reference to the accompanying drawings.

1. Method for Manufacturing Ferroelectric Memory

First, a method for manufacturing a ferroelectric memory 120 in accordance with the embodiment is described with reference to the accompanying drawings. FIGS. 1-10 are cross-sectional views schematically showing a process for manufacturing a ferroelectric memory in accordance with the embodiment.

Figure 1:
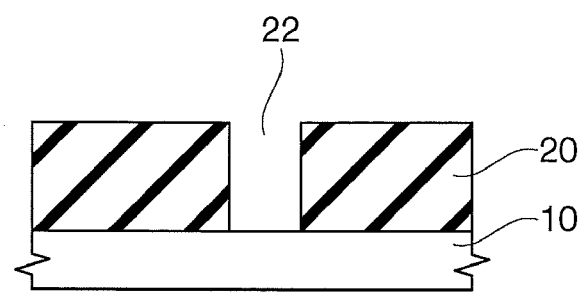
FIG. 1 is a cross-sectional view schematically showing a step in a method for manufacturing a ferroelectric memory in accordance with an embodiment of the invention.

First, as shown in FIG. 1, a second dielectric layer 20 is formed on a base substrate 10. The base substrate 10 includes a substrate. The substrate may be, for example, a semiconductor substrate (silicon substrate). Also, the base substrate 10 may include a single transistor or plural transistors on the substrate. Each of the transistors includes impurity regions that define a source region and a drain region, respectively, a gate dielectric layer and a gate electrode. An element isolation region may be formed between the transistors, thereby electrically insulating the transistors from one another.

When the base substrate 10 is formed from a silicon substrate, the second dielectric layer 20 may be formed from a silicon oxide layer. As the second dielectric layer 20, an oxide layer, such as, for example, a BPSG (boro-phospho SG), a NSG (non-doped SG) or a PTEOS (plasma TEOS) may be formed to a thickness of, for example, 1.0 μm or greater. The second dielectric layer 20 is formed on a surface of the base substrate 10 where the plural transistors are formed. The second dielectric layer 20 may be formed in a manner to cover the entire top surface of the base substrate 10, and may be formed by using known technology, such as, for example, a CVD (chemical vapor deposition) method.

It is noted that the second dielectric layer 20 may be polished by a planarizing technique such as a CMP (Chemical Mechanical Polishing) method or the like.

Next, as shown in FIG. 1, a second contact hole 22 that penetrates the second dielectric layer 20 is formed. The second contact hole 22 is formed in a manner to expose the base substrate 10. Also, the second contact hole 22 may be formed, for example, in a manner to expose the impurity region of the transistor described above. The second contact hole 22 may be formed by a photolithography technique. Concretely, a resist layer (not shown) that opens in a portion of the second dielectric layer 20 is formed, and dry-etching is conducted at the opening section in the resist layer, thereby forming the second contact hole 22.

Figure 2:
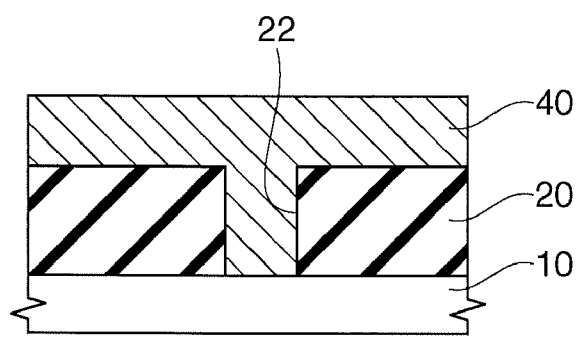
FIG. 2 is a cross-sectional view schematically showing a step in the method for manufacturing a ferroelectric memory in accordance with the embodiment of the invention.

Next, as shown in FIG. 2, a second conductive layer 40 is formed inside the second contact hole 22 and on the second dielectric layer 20. The second conductive layer 40 is formed in a manner to embed the interior of the second contact hole 22.

It is noted that, prior to forming the second conductive layer 40, a barrier layer (not shown) may be formed along the inner surface of the second contact hole 22. When the barrier layer is formed, the second conductive layer 40 is formed on the barrier layer. The second conductive layer 40 may be formed by a CVD method. The second conductive layer 40 may be formed from, for example, a tungsten layer (W layer).

Figure 3:
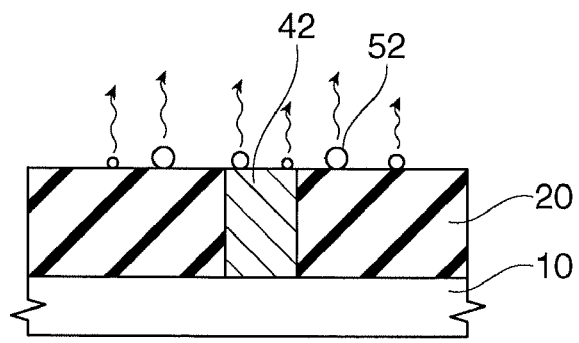
FIG. 3 is a cross-sectional view schematically showing a step in the method for manufacturing a ferroelectric memory in accordance with the embodiment of the invention.

Then, as shown in FIG. 3, by polishing the second conductive layer 40, a second contact plug 42 is formed. In the polishing step, the working surface is polished and planarized. The polishing may be conducted by a CMP method. In the example shown in FIG. 3, the second conductive layer 40 is polished until the second dielectric layer 20 is exposed. It is noted that the second contact plug 42 may be electrically connected to one of the transistors within the base substrate 10.

Next, the upper surface of the second dielectric layer 20 and the second contact plug 42 is washed, thereby removing residues of the second conductive layer 40 or the like. Washing may be conducted by spray washing with pure water, water solution, alcohol solution or the like, or by etching.

Next, the top surface of the second dielectric layer 20 and the second contact plug 42 is heated at 350° C. to 600° C. while reducing the pressure to $1 \times 10^{-3}$ Pa through $1 \times 10^{-7}$ Pa. By this, moisture 52 adhered to the top surface of the second dielectric layer 20 and the second contact plug 42 in the washing step described above can be removed.

The heating temperature is described below in detail. As described above, the heating temperature may preferably be at 350° C. to 600° C. The reason is described with reference to FIG. 11.

Figure 11:
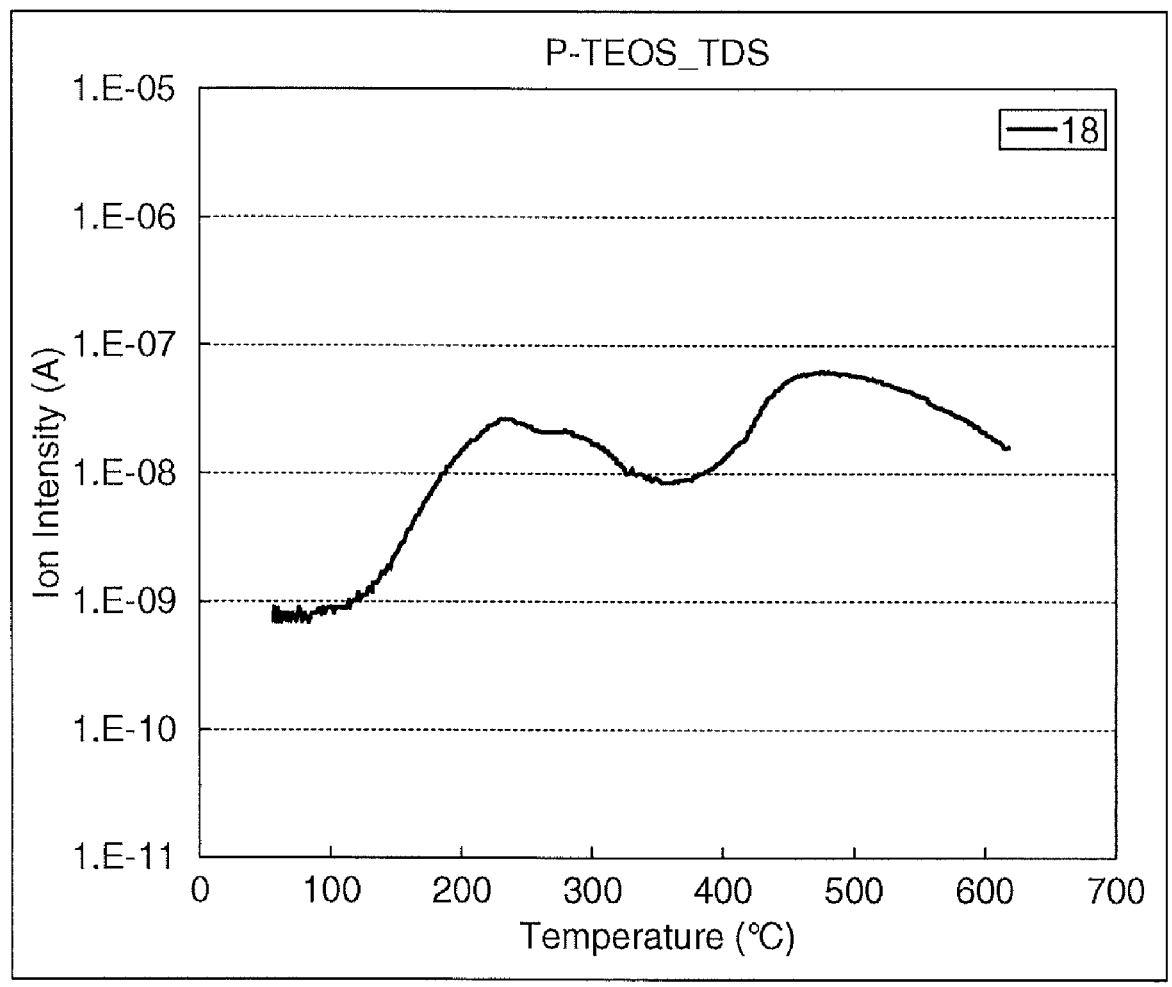
FIG. 11 is a graph showing the relation between the amount of water ($H_2O$) and hydrogen ($H_2$) that desorb from the dielectric layer.

FIG. 11 is a graph showing the relation between the amount of water ($H_2O$) that desorbs from the dielectric layer and the temperature. In FIG. 11, along the horizontal axis are plotted temperatures (C.°), and along the vertical axis are plotted ion intensities (A), which indicates the amount of water desorbed from the dielectric layer. In this example, PTEOS is used as the dielectric layer, and TDS (Thermal Desorption Spectroscopy) measurement is conducted for water.

Peaks of water are observed near 230° C. and near 470° C. The peak near 230° C. is assumed to be a peak that originates mainly from water adsorbed to the surface of the PTEOS. On the other hand, the peak near 470° C. is assumed to be a peak that originates mainly from desorbed water that has been hydrogen-bonded to silanol groups in the PTEOS. Also, the minimum value between the peak near 230° C. and the peak near 470° C. is observed near 350° C. Accordingly, when the heating temperature is set to 350° C. or higher, substantially all of the water adsorbed at least to the surface of the PTEOS can be desorbed and removed. Also, when the heating temperature is elevated to about 600° C., substantially all of the water hydrogen-bonded to silanol groups in the PTEOS can be desorbed and removed. In this manner, by setting the heating temperature between 350° C. and 600° C., moisture can be removed, and the ferroelectric layer can be prevented from being deteriorated by hydrogen that may be generated when water is decomposed in manufacturing steps to be conducted later.

Figure 4:
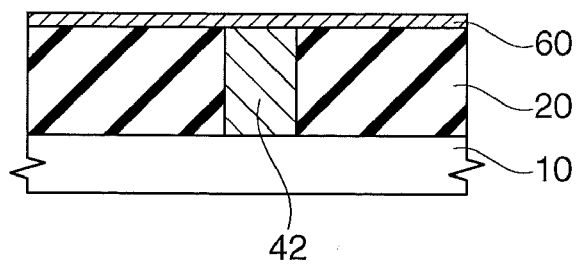
FIG. 4 is a cross-sectional view schematically showing a step in the method for manufacturing a ferroelectric memory in accordance with the embodiment of the invention.

Next, as shown in FIG. 4, a first barrier layer 60 is formed on the second dielectric layer 20 and the second contact plug 42. The first barrier layer 60 may be composed of any material having oxidation preventing function and conductivity without any particular limitation, such as, for example, titanium, nitride of titanium (for example, TiN) or nitride of titanium and aluminum (for example, TiAlN), and may be formed by a known method such as reactive sputtering. By forming the first barrier layer 60 in this manner, a ferroelectric capacitor 80 to be described below can be prevented from being oxidized. Also, after the heating step under a reduced pressure described above, the first barrier layer 60 may preferably be formed without being exposed to the air atmosphere. By forming the first barrier layer 60 without exposing to the air atmosphere, adhesion of moisture in the air atmosphere can be prevented.

Figure 5:
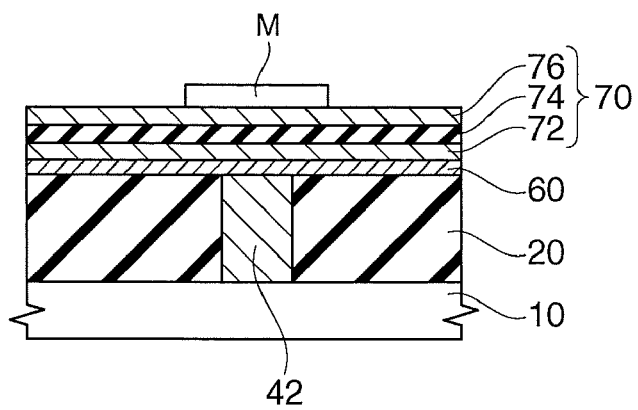
FIG. 5 is a cross-sectional view schematically showing a step in the method for manufacturing a ferroelectric memory in accordance with the embodiment of the invention.

Next, as shown in FIG. 5, a lower electrode 72 is formed on the first barrier layer 60. The lower electrode 72 may be formed from, for example, Pt, Ir, Ir oxide ($IrO_x$), Ru, Ru oxide ($RuO_x$), or SrRu complex oxide ($SrRuO_x$). The lower electrode 72 may be formed in a single layer or a plurality of layers. The method for forming the lower electrode 72 may be appropriately selected depending on its material, and for example, a sputtering method, a vacuum deposition method, or a CVD method may be applied.

Next, as shown in FIG. 5, a ferroelectric layer 74 is formed on the lower electrode 72. The ferroelectric layer 74 may be formed with PZT system ferroelectric composed of oxide including Pb, Zr and Ti as constituent elements. Alternatively, Pb(Zr,Ti,Nb)O$_3$ (PZTN system) material in which Nb is doped at the Ti site may be used. Also, the ferroelectric layer 74 may be composed of, for example, any of SBT system, BST system, BIT system and BLT system materials, without being limited to the materials described above.

The film forming method for forming the ferroelectric layer 74 may be appropriately selected depending on its material. For example, a solution coating method (including, for example, a sol-gel method and a MOD (metal organic decomposition) method), a sputter method, a CVD method, or a MOCVD (metal organic chemical vapor deposition) method can be used. It is noted that the ferroelectric layer 74, after having been formed to a desired thickness, is heated for crystallization in a temperature range between 500° C. and 700° C. for several minutes to several hours in an oxygen atmosphere.

Then, as shown in FIG. 5, an upper electrode 76 is formed on the ferroelectric layer 74. The upper electrode 74 may be formed with material and by a method similar to those applied to the lower electrode 72. The lower electrode 72 and the upper electrode 76 are not limited to a specific combination. For example, an Ir layer may be used as the lower electrode 72, and an IrO$_x$ layer may be used as the upper electrode 76. It is noted that, after forming the upper electrode 76, an anneal treatment may be conducted if necessary.

By the steps described above, a laminate 70 having the lower electrode 72, the ferroelectric layer 74 and the upper electrode 76 is formed.

Next, the laminate 70 and the first barrier layer 60 are patterned in a batch. A mask M is used for patterning the laminate 70. For example, a resist mask may be used as the mask M.

Figure 6:
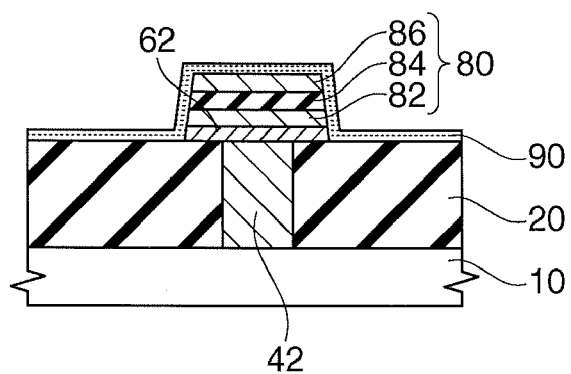
FIG. 6 is a cross-sectional view schematically showing a step in the method for manufacturing a ferroelectric memory in accordance with the embodiment of the invention.

Areas of the laminate 70 which are exposed through the resist mask are etched, thereby forming a ferroelectric capacitor 80 and a first barrier layer 60. In this manner, as shown in FIG. 6, the ferroelectric capacitor 80 is formed. The ferroelectric capacitor 80 includes a lower electrode 82, a ferroelectric layer 84 and an upper electrode 86. A first barrier layer 62 is formed between the ferroelectric capacitor 80 and the second contact plug 42. The first barrier layer 62 has the same plane configuration as that of the lower electrode 82 of the ferroelectric capacitor 80. It is noted that, after the ferroelectric capacitor 80 has been patterned, an anneal treatment may be conducted if necessary.

Furthermore, after the ferroelectric capacitor 80 has been formed, a second barrier layer 90 that covers at least the ferroelectric capacitor 80 is formed to prevent the ferroelectric capacitor 80 from being deteriorated by the influence of hydrogen. In the example shown in FIG. 5, the second barrier layer 90 is formed after the mask M has been removed. The second barrier layer 90 may be formed from an inorganic system material layer (for example, an aluminum oxide layer (AlO$_x$ layer)). The second barrier layer 90 may be formed in a manner not only to cover the ferroelectric capacitor 80 but also to cover the second dielectric layer 20. It is noted that the second barrier layer 90 may be formed in, for example, about several hundred Å in thickness by, for example, a sputter method or a CVD method.

Figure 7:
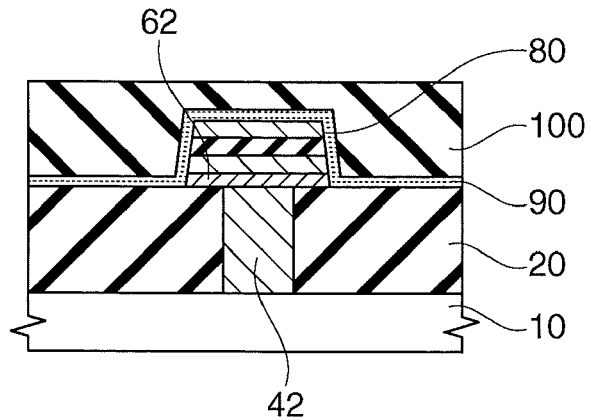
FIG. 7 is a cross-sectional view schematically showing a step in the method for manufacturing a ferroelectric memory in accordance with the embodiment of the invention.
Figure 8:
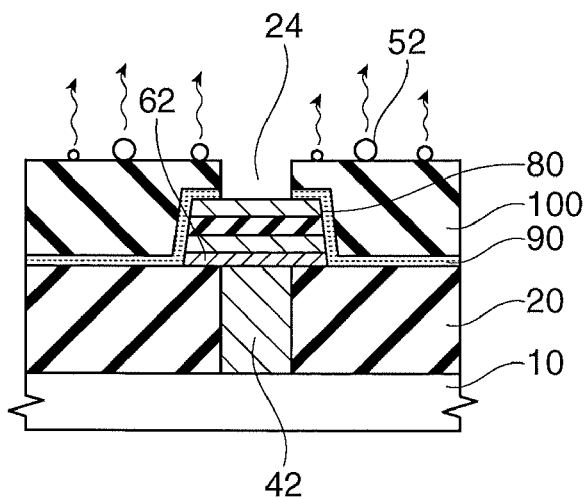
FIG. 8 is a cross-sectional view schematically showing a step in the method for manufacturing a ferroelectric memory in accordance with the embodiment of the invention.

As shown in FIG. 7, a first dielectric layer 100 that covers the ferroelectric capacitor 80 and the second barrier layer 90 is formed above the second dielectric layer 20. The first dielectric layer 100 may be formed with materials and methods similar to those applied to the second dielectric layer 20 described above.

Next, a first contact hole 24 that penetrates the first dielectric layer 100 is formed. The first contact hole 24 is formed above the ferroelectric capacitor 80 in a manner to expose at least a portion of the top surface of the upper electrode 86. Accordingly, a portion of the first dielectric layer 100 and the second barrier layer 90 is removed by dry etching. The first contact hole 24 may be formed by a method similar to the method applied to form the second contact hole 22 described above.

Then, the top surface of the first dielectric layer 100 and the ferroelectric capacitor 80 is washed, thereby removing residues of the first dielectric layer 100. It is noted that the washing may be conducted by spray washing with pure water, water solution, alcohol solution or the like, or by etching.

Next, the top surface of the first dielectric layer 100 and the ferroelectric capacitor 80 is heated at 350° C. to 600° C. while reducing the pressure to $1\times10^{-3}$ Pa to $1\times10^{-7}$ Pa. By this, moisture 52 adhered to the top surface of the first dielectric layer 100 and the ferroelectric capacitor 80 in the washing step described above can be removed. The reason why the heating temperature is preferably set in a rage between 350° C. and 600° C. is the same as described above. Also, by this heating step, a recovery annealing effect can be achieved, whereby the deterioration caused by process damage in sputtering described above can be reduced.

Figure 9:
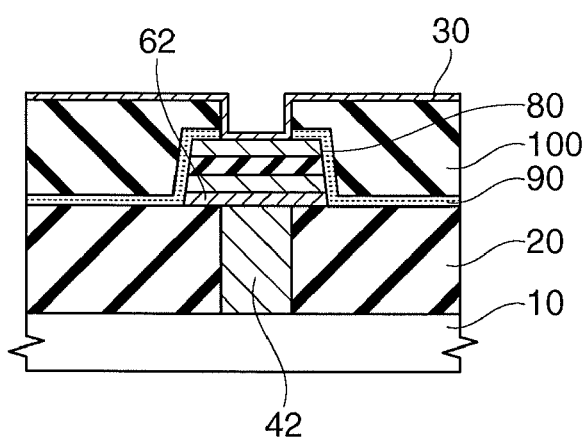
FIG. 9 is a cross-sectional view schematically showing a step in the method for manufacturing a ferroelectric memory in accordance with the embodiment of the invention.

Next, as shown in FIG. 9, a third barrier layer 30 is formed inside the first contact hole 24 and on the first dielectric layer 100. The third barrier layer 30 may be formed with material and by a forming method similar to those applied to the first barrier layer 60 described above. Also, after the heating step under the reduced pressure described above, the third barrier layer 30 may preferably be formed without exposing to the air atmosphere. By forming the third barrier layer 30 without exposing to the air atmosphere, adhesion of moisture of the air atmosphere can be prevented.

Figure 10:
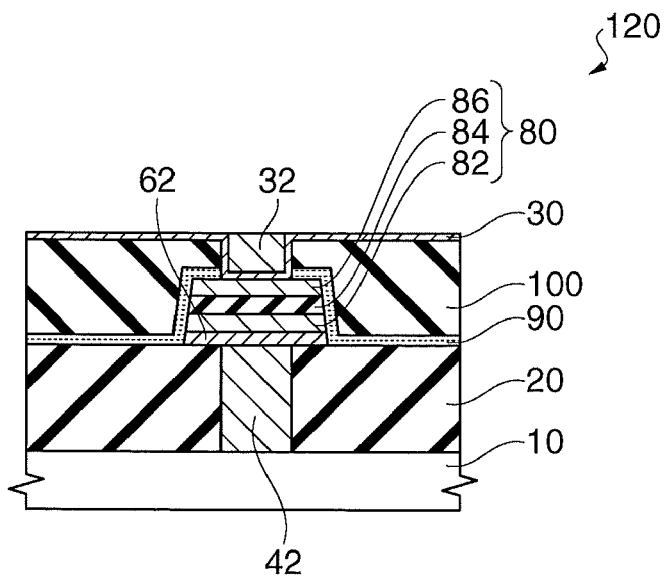
FIG. 10 is a cross-sectional view schematically showing a step in the method for manufacturing a ferroelectric memory in accordance with the embodiment of the invention.

Next, as shown in FIG. 10, a first contact plug 32 is formed. More concretely, a second conductive layer is formed on the top surface of the third barrier layer 30, and a portion thereof is removed by polishing or the like, whereby the first contact plug 32 can be formed.

By the steps described above, a ferroelectric memory 120 in accordance with the present embodiment can be manufactured. In the process for manufacturing the ferroelectric memory 120 in accordance with the present embodiment, the top surface of each of the dielectric layers is washed, and heating treatment is then conducted. As a result, residues and the like generated in the etching process can be removed, and moisture adhered to the surface of the dielectric layer at the time of washing and moisture within the dielectric layer can be removed, such that deterioration of the characteristics of the ferroelectric memory 120 can be prevented.

It is noted that, in accordance with the present embodiment, the top surface of the second dielectric layer 20 is washed and heat-treated, after forming the second contact plug 42 (see FIG. 2 and FIG. 3). However, instead of the above, the washing and heat treatment steps can be conducted after the second contact hole 22 has been formed, in other words, before the second conductive layer 40 is formed. By this, deterioration of the contact plug 42 can be suppressed.

Also, a barrier metal layer may be formed between the contact plug 42 and the inner wall of the second contact hole 22. By this, the orientation of the contact plug 42 can be made better, and oxidation thereof can be prevented.

Embodiments of the invention are described above in detail. However, a person having an ordinary skill in the art should readily understand that many modifications can be made without departing in substance from the novel matter and effect of the invention. Accordingly, those modified examples are also deemed included in the scope of the invention.

What is claimed is:

1. A method for manufacturing a ferroelectric memory, the method comprising:
    forming a ferroelectric capacitor above a substrate;
    forming a first dielectric layer that covers the ferroelectric capacitor;
    forming a first contact hole in the first dielectric layer to expose an upper surface of the ferroelectric capacitor;
    washing a first surface of the first dielectric layer with the upper surface exposed by using a first solution after the forming of the first contact hole;
    heating the first dielectric layer with the upper surface exposed after the washing; and
    forming a first conductive layer inside the first contact hole.

2. The method according to claim 1, wherein the heating of the first dielectric layer is conducted at a minimum of approximately 350° C.

3. The method according to claim 1, wherein the heating of the first dielectric layer is conducted at approximately 350° C. to 600° C.

4. The method according to claim 1, further comprising reducing pressure during the heating of the first dielectric layer.

5. The method according to claim 1, further comprising reducing pressure to approximately between $1\times10^{-3}$ Pa to $1\times10^{-7}$ Pa during the heating of the first dielectric layer.

6. The method according to claim 1, further comprising forming a first barrier layer inside the first contact hole between the heating of the first dielectric layer and the forming of the first conductive layer, wherein the first surface of the first dielectric layer is protected from exposure to an atmosphere between the heating of the first dielectric layer and the forming of the first conductive layer.

7. The method according to claim 6, wherein the first barrier layer includes Ti, TiN, or TiAlN.

8. The method according to claim 1, wherein the first solution is substantially pure water, a water solution, or an alcohol solution.

9. The method according to claim 1, wherein the ferroelectric capacitor includes a lower electrode, a ferroelectric layer, and an upper electrode.

10. The method according to claim 1, further comprising:
    before the forming of the ferroelectric capacitor, forming a second dielectric layer above a substrate;
    forming a second contact hole in the second dielectric layer;
    forming a second conductive layer inside the second contact hole and above the second dielectric layer;
    polishing the second conductive layer until a second surface of the second dielectric layer is exposed; and
    heating the second dielectric layer with the second surface exposed.

11. The method according to claim 10, wherein the heating of the second dielectric is conducted at a minimum of approximately 350° C.

12. The method according to claim 10, wherein the heating of the second dielectric layer is conducted at approximately 350° C. to 600° C.

13. The method according to claim 10, further comprising reducing pressure during the heating of the second dielectric layer.

14. The method according to claim 10, further comprising reducing pressure to approximately between $1\times10^{-3}$ Pa to $1\times10^{-7}$ Pa during the heating of the second dielectric layer.

15. The method according to claim 10, further comprising forming a second barrier layer above the second dielectric layer between the heating of the second dielectric layer and the forming of the ferroelectric capacitor, wherein the second surface of the second dielectric layer is protected from exposure to an atmosphere between the heating of the second dielectric layer and the forming of the second barrier layer.

16. The method according to claim 15, wherein the second barrier layer includes Ti, TiN, or TiAlN.

17. The method according to claim 10, further comprising, between the polishing of the second conductive layer and the heating of the second dielectric layer, washing the second surface of the second dielectric layer with the second surface exposed by using a second solution.

18. The method according to claim 17, wherein the second solution is substantially pure water, a water solution, or an alcohol solution.

19. The method according to claim 1, further comprising, between the forming of the ferroelectric capacitor and the forming of the first dielectric capacitor, forming a third barrier layer above the ferroelectric capacitor.

20. The method according to claim 19, wherein the third barrier layer includes aluminum oxide.

* * * * *